Figure 3A:
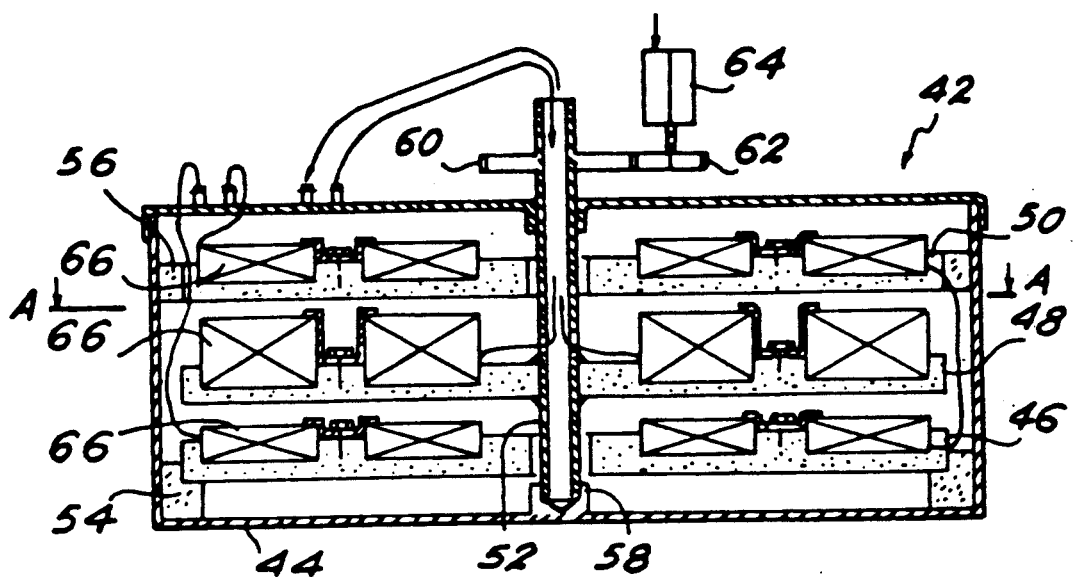

United States Patent [19]

Chaudanson

[11] Patent Number: 5,202,894
[45] Date of Patent: Apr. 13, 1993

[54] ELECTRIC SUPPLY DEVICE FOR ONE OR MORE METAL VAPOR LASERS USING AN ELECTRIC POWER CHARGING CIRCUIT WITH A VARIABLE INDUCTOR TO PROVIDE A VARIABLE CHARGING GRADIENT

[75] Inventor: Bernard Chaudanson, LaGarde Adhemar, France

[73] Assignee: Commissariat a l'Energie Atomique, Paris, France

[21] Appl. No.: 925,812

[22] Filed: Aug. 4, 1992

Related U.S. Application Data

[63] Continuation of Ser. No. 652,677, Feb. 7, 1991, abandoned.

[30] Foreign Application Priority Data

Feb. 8, 1990 [FR] France ................ 90 01455

[51] Int. Cl.[5] .................... H01S 3/0975; H02M 9/06
[52] U.S. Cl. ........................ 372/38; 307/108; 363/90; 372/82
[58] Field of Search ............ 363/90; 323/260, 262, 323/264; 307/34, 107, 108; 372/30, 31, 38, 82

[56] References Cited

U.S. PATENT DOCUMENTS

| | | | |
|---|---|---|---|
| 3,211,915 | 10/1965 | Poehlman et al. | |
| 3,363,184 | 1/1968 | Smith | 328/65 |
| 3,749,975 | 7/1973 | Walters | 315/241 R |
| 4,288,758 | 9/1981 | Seguin et al. | 372/38 |
| 4,336,587 | 6/1982 | Boettcher, Jr. et al. | 363/134 |
| 4,378,586 | 3/1983 | Bete | 363/56 |
| 4,405,889 | 9/1983 | Overstreet et al. | 320/1 |
| 4,549,091 | 10/1985 | Fahlen et al. | 307/106 |
| 4,607,322 | 8/1986 | Henderson | 363/56 |
| 4,939,381 | 7/1990 | Shibata et al. | 372/38 |
| 5,072,191 | 12/1991 | Nakajima et al. | 372/38 |
| 5,079,689 | 1/1992 | Gidon et al. | 363/131 |

FOREIGN PATENT DOCUMENTS

| | | | |
|---|---|---|---|
| 0072153 | 2/1983 | European Pat. Off. | |
| 1439680 | 4/1966 | France . | |
| 2575010 | 6/1986 | France . | |
| 115591 | 9/1991 | Japan | 372/82 |
| 98936 | 7/1961 | Netherlands | 323/264 |
| 197359 | 10/1964 | Sweden | 363/90 |
| 1107127 | 3/1968 | United Kingdom . | |

OTHER PUBLICATIONS

Journal of Physics E: Scientific Instruments, 21 (1988), pp. 388-392, "Design and Performance of a 20 watt copper vapour laser" by Mittal et al.

Journal of Physics E: Scientific Instruments, 21 (1988), pp. 218-224, "An efficient laser pulsar using ferrite magnetic switches" by Bakert et al.

*Primary Examiner*—William H. Beha, Jr.
*Attorney, Agent, or Firm*—Michael N. Meller

[57] ABSTRACT

Electric supply device for at least one metal vapor laser includes a convertor for converting an a.c. voltage into a d.c. voltage of fixed amplitude. Means are provided for supplying a pulse voltage with a maximum amplitude that can be regulated. An electric power charging circuit including a variable inductor is used for regulating the maximum amplitude of the pulse voltage for each laser.

7 Claims, 5 Drawing Sheets

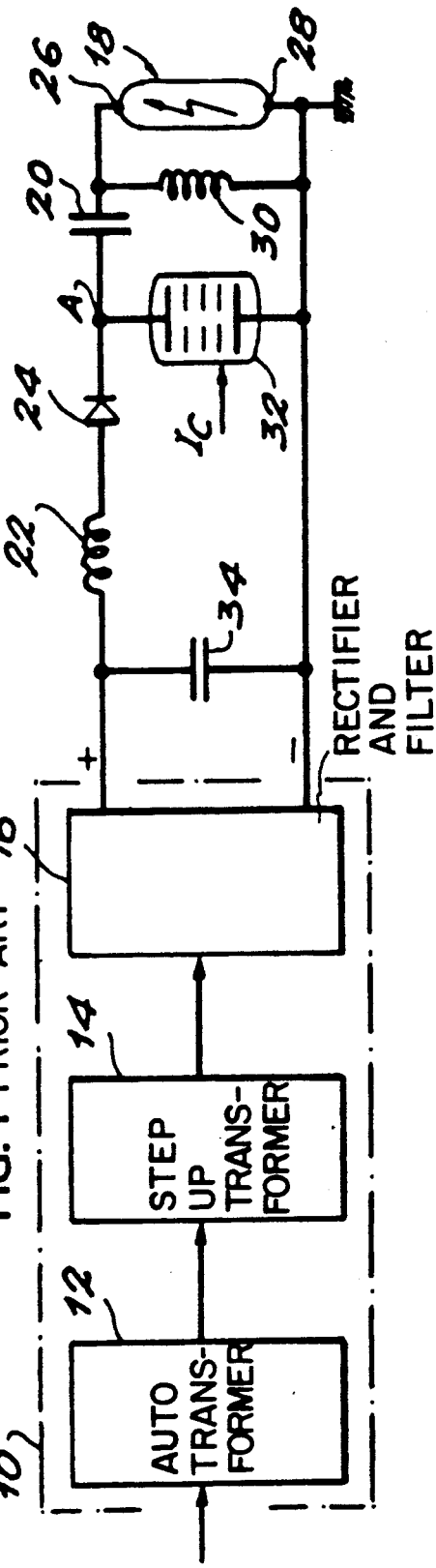
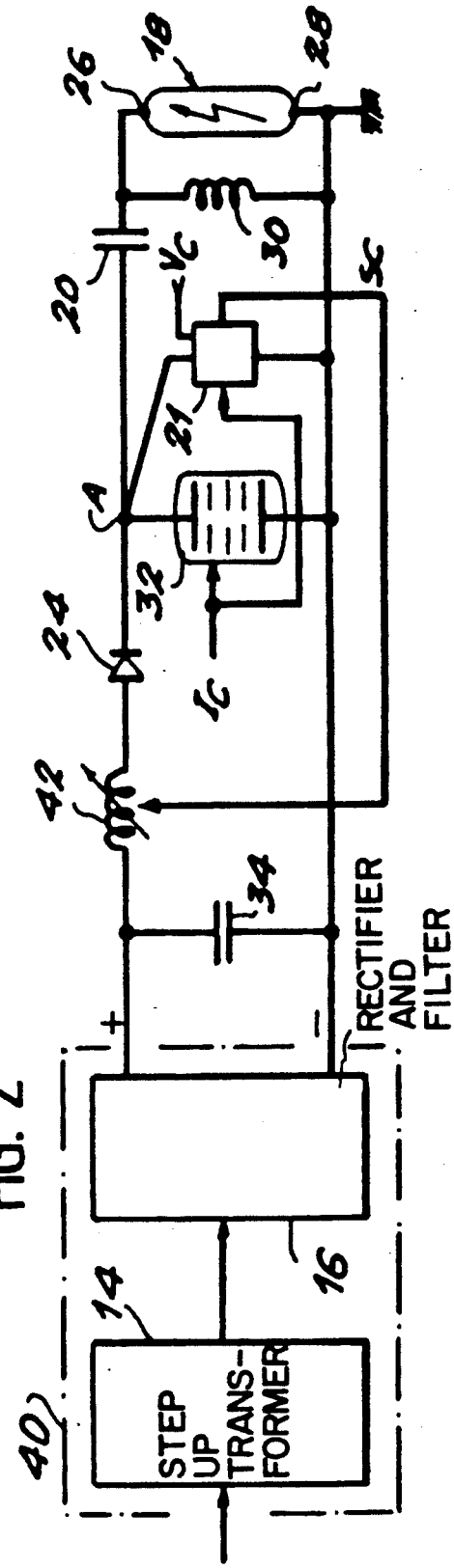

ELECTRIC SUPPLY DEVICE FOR ONE OR MORE METAL VAPOR LASERS USING AN ELECTRIC POWER CHARGING CIRCUIT WITH A VARIABLE INDUCTOR TO PROVIDE A VARIABLE CHARGING GRADIENT

This application is a continuation of application Ser. No. 652,677, filed Feb. 7, 1991, now abandoned.

DESCRIPTION

The present invention relates to an electric supply device for one or more metal vapour lasers. It more particularly applies to the simultaneous electric supply of a large number of metal vapour lasers.

With reference to FIG. 1 a description will now be given of a conventional device for supplying a metal vapour laser. In known manner, the a.c. voltage supplied e.g. by a three-phase 380 V network or mains is converted by a converter 10 into a d.c. voltage, but whose amplitude can be regulated at random.

The converter 10 has a variable autotransformer regulating module 12 and supplies a variable amplitude a.c. voltage. A step-up transformer of fixed transformation ratio 14 transforms said variable a.c. voltage in to a variable amplitude high a.c. voltage. A rectifying and filtering circuit 16 transmits the high a.c. voltage into a high variable amplitude d.c. voltage.

This high d.c. voltage supplied between the negative and positive terminals of the converter 10 is transformed into a pulse voltage supplied to the electrodes of the tube 18 of the metal vapour laser. The pulse voltage is produced as a result of the discharge of a charging capacitor 20.

A fixed inductance induction coil 22 is connected to the positive output of the converter and also to an electrode of a diode 24. The other electrode of the diode 24 is connected at a point A to a plate of the capacitor 20. The other plate of the capacitor 20 is connected to a first electrode 26 of the tube 18. The other electrode 28 of the tube 18 is raised to earth potential.

An induction coil 30, whose inductance is approximately 50 nH, is connected in a parallel arrangement to the electrodes 26,28 of the tube 18. This coil 30, whose inductance is well above that of the tube 18 allows the charging of the capacitor 20.

An electric control pulse Ic leads to the sudden closing of the controllable switch 32, e.g. a thyratron, which is connected to point A on the one hand and to the negative output of the converter 10 on the other. The closing of the switch 32 brings about the discharge of the capacitor 20 across the tube 18.

A capacitor 34 connected in parallel arrangement to the positive and negative outputs of the converter 10 makes it possible to avoid the voltage drop due to the call for current during the recharging of the capacitor 20 (serving as an energy accumulator).

The fact that the peak amplitude of the voltage pulse is regulatable makes it possible to match the energy quantity supplied to the laser tube as a function of the characteristics thereof. The effects of aging, the metal quantity or other parameters mean that there are differences between the individual tubes.

The converter of such a known device is regulated for a given laser and cannot be used for simultaneously supplying several lasers.

The aim of the present invention is to supply a supply device, whose converter can be used for a large number of lasers.

For this purpose the invention recommends the conversion of the a.c. voltage supplied by the mains into a fixed amplitude d.c. voltage, the regulation of the peak amplitude of the pulse voltage taking place at the charging circuit of the charging capacitor. This makes it possible to increase the electrical conversion efficiency and also reduce the cost and volume of the supply device.

When a single converter is used for all the lasers, it may be isolated in a separate room or location and connected to the lasers by coaxial connections.

The present invention specifically relates to an electric supply device incorporating a converter for converting an a.c. voltage into a fixed amplitude d.c. voltage and at least one means for supplying, from the said d.c. voltage, a variable maximum amplitude pulse voltage.

The means for supplying a variable maximum amplitude pulse voltage comprises a controllable switch connected to an electric power charging circuit having a variable charging gradient and able to discharge said power as a result of the closure of said controllable switch.

Preferably, electric power or energy charging takes place in a charging capacitor connected at a point A to one electrode of a diode, its other electrode being connected to a variable induction coil making it possible to vary the charging gradient of the charging circuit.

According to a first variant, said variable induction coil incorporates a magnetic core which moves longitudinally in the coil axis.

According to a second variant, said variable induction coil incorporates two coils, which move with respect to one another and which are connected in series in such a way as to have a mutual inductance dependent on their respective position.

According to a third variant, said variable induction coil incorporates a ferromagnetic core introduced into a coil, a control winding surrounding the ferromagnetic core and means for making a current flow in the control windings so as to vary the induction of the core.

The invention is described in greater detail hereinafter relative to non-limitative embodiments and the attached drawings, wherein show:

FIG. 1, already described relating to the prior art, diagrammatically an electric supply device for a metal vapour laser.

FIG. 2 diagrammatically an electric supply device according to the invention.

Figure 3B:
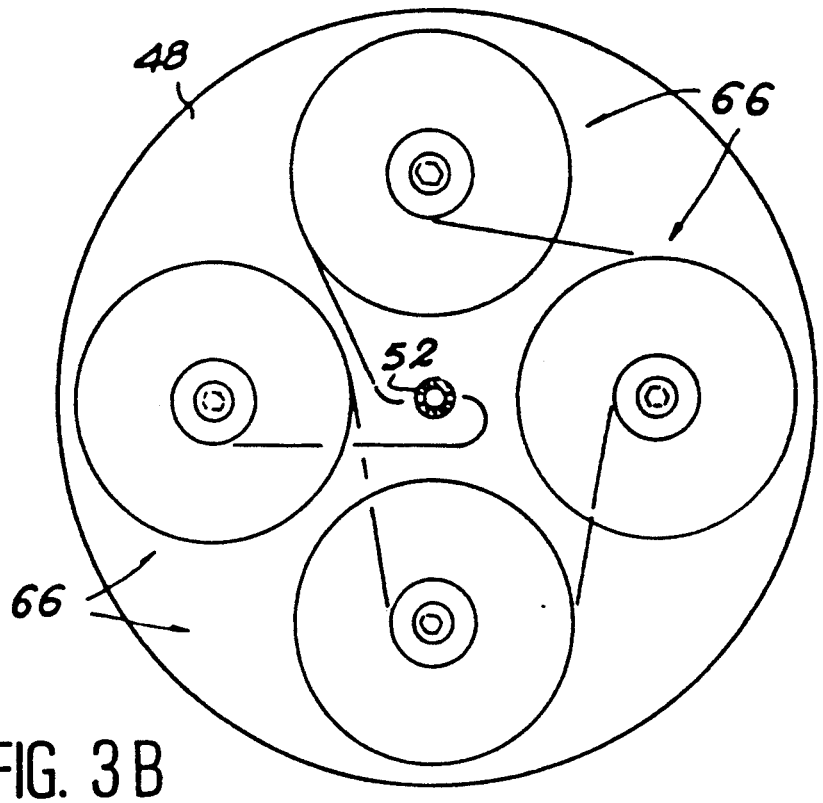

FIGS. 3A and 3B diagrammatically a construction of a variable mutual induction coil in section and along axis AA thereof.

Figure 4:
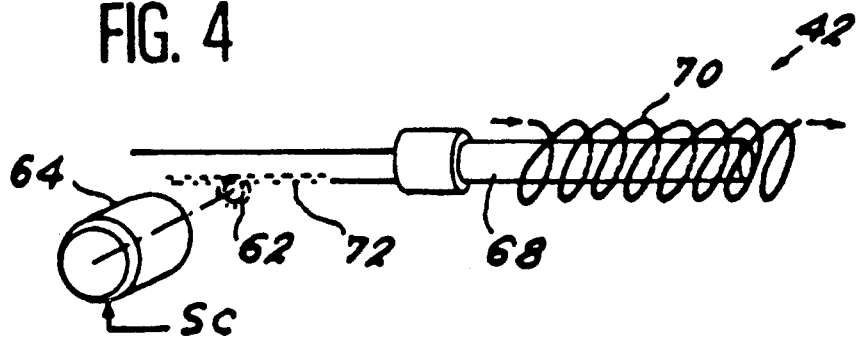

FIG. 4 diagrammatically a construction of a variable mutual induction coil.

Figure 5:
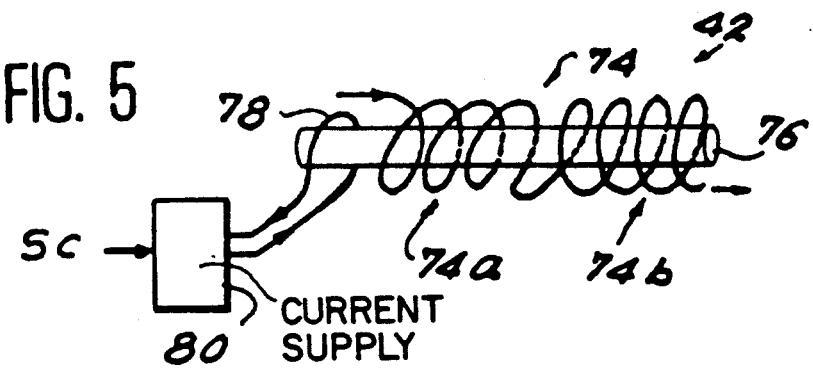

FIG. 5 diagrammatically another construction of a variable induction coil.

Figure 6:
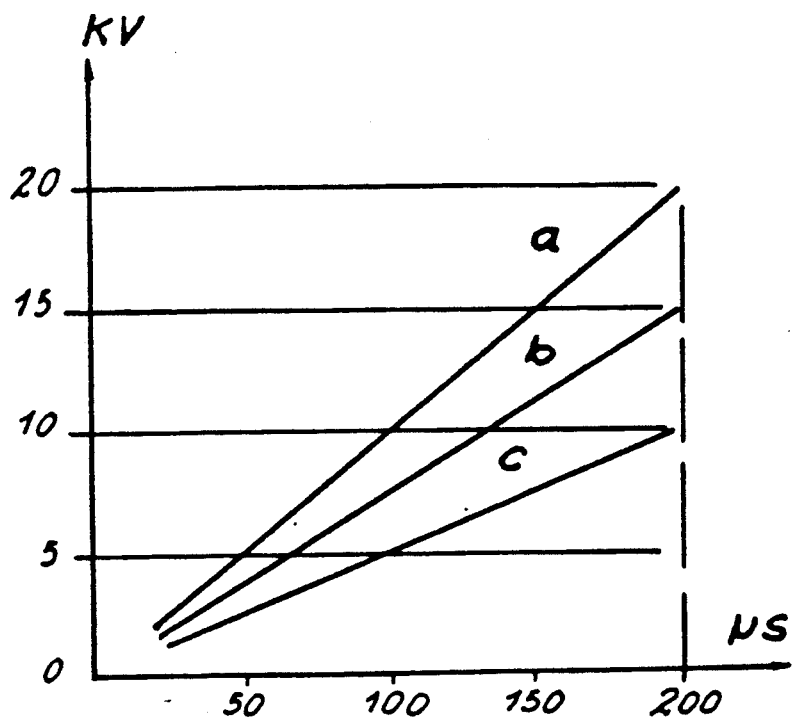

FIG. 6 diagrammatically various charging curves of an electric supply device as in FIG. 2.

Figure 7:
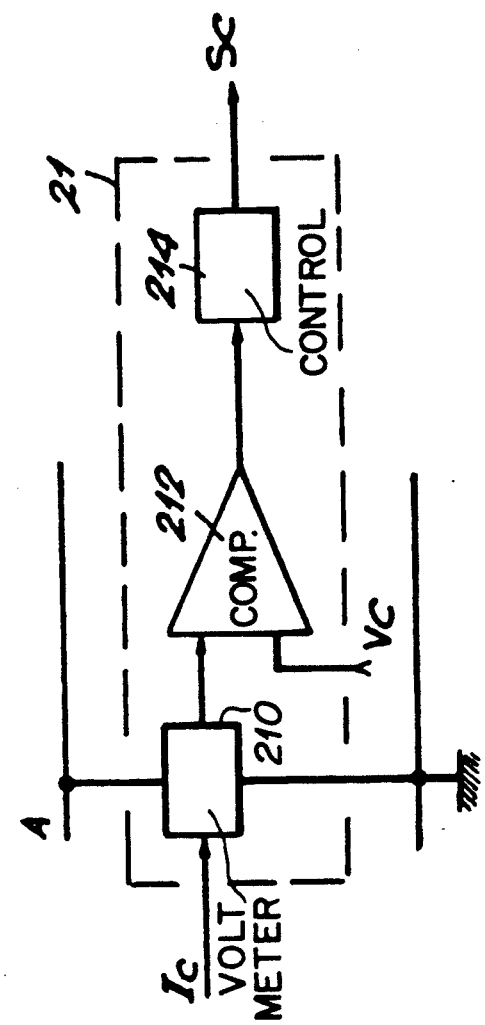

FIG. 7 diagrammatically a closed-loop control means used in a supply device according to the invention.

Figure 8:
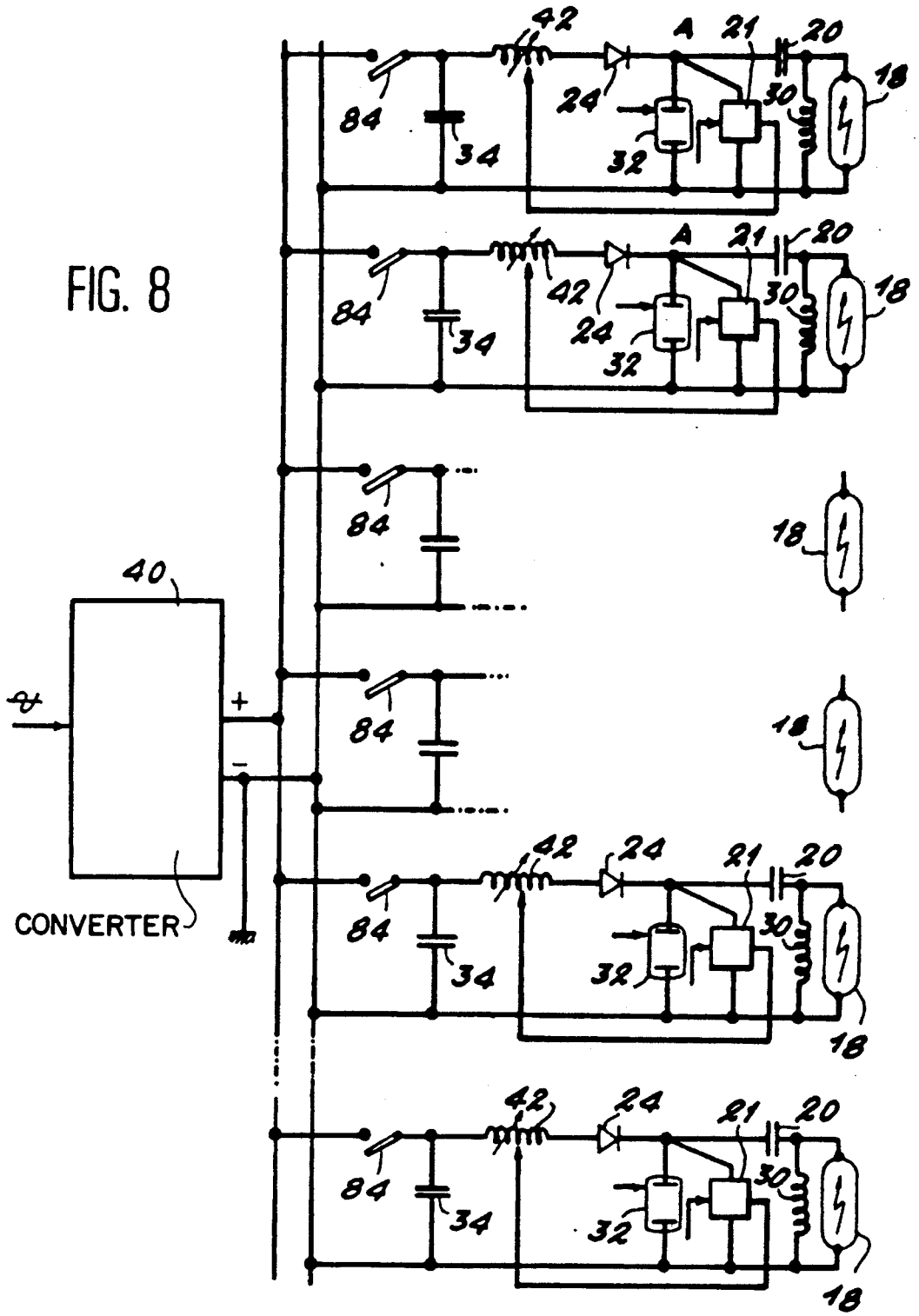

FIG. 8 diagrammatically an electric supply device according to the invention when simultaneously supplying several lasers.

FIG. 2 diagrammatically shows an electric supply device for supplying a metal vapour laser. A converter 40 connected to the mains and therefore supplied by a three-phase 380 V a.c. voltage supplies a high fixed amplitude d.c. voltage between its positive and negative outputs. This converter 40 has a step-up transformer 14 with a fixed transformation ratio connected to a rectifying and filtering circuit 16.

In this embodiment, the high d.c. voltage is transformed into a pulse voltage by a circuit having a variable charging gradient. This circuit incorporates a variable induction coil 42 connected on the one hand to the positive output of the converter 40 and on the other to one electrode of a diode 24. The other electrode of the latter is connected at a point A to one plate of a charging capacitor 20. The other plate of the capacitor 20 is connected to the electrode 26 of the laser tube 18.

With reference to FIGS. 3A and 3B, a description will now be given of a first embodiment of a variable induction coil. A cylindrical vessel 44 with an oil flow contains three parallel insulating disks 46,48,50, centrally perforated so as to allow the passage of a hollow, insulating spindle 52. The disks 46 and 50 are fixed to rings 54,56 integral with the vessel 44. The central disk 48 is integral with the spindle 52, which is fitted into a bearing 58 welded or bonded to the bottom of the vessel 44. At the end of the vessel 44, the spindle 52 is provided with a toothed ring engaged in a pinion 62 integral with the spindle or shaft of a motor 64.

Each disk 46,48,50 supports four flat coils 66 arranged symmetrically with respect to their centres and as can be seen in the front view of the disk 48 (FIG. 3B). Each coil 66 is wound in the reverse direction compared with the windings of the adjacent coils. The four coils 66 of a disk are connected to one another in a series arrangement. The coils 66 of the disks 46 and 50 are superimposed, the facing coils being wound in the same direction. Moreover, the coils 66 of the disks 46 and 50 are connected in series with one another.

The coils 66 of the central disk 48 have twice as many windings as the coils 66 of the disks 46,50. The current supply and discharge wire of the coils of the central disk 48 traverse the hollow shaft 52 and are connected to insulators outside the vessel 44.

Inductance variations are obtained by modifying, by rotation, the position of the central disk 48. Maximum inductance obtained when the coils supported by the central disk 48 are superimposed with the coils of the disks 46 and 50, the facing coil windings being in the same direction. The minimum inductance obtained by pivoting the central disk 48 by 90° from the maximum inductance position.

FIG. 4 diagrammatically shows another embodiment of a variable inductance coil. The inductance variation is obtained by regulating the penetration length of a bar magnet 68 within the coil 70. The bar magnet 68 is integral with a rack 72 engaged in a pinion 62 placed at the end of the shaft of a motor 64. Thus, the bar magnet can be moved in translation in accordance with the longitudinal axis of the coil 70.

FIG. 5 diagrammatically shows another embodiment of a variable inductance coil. The inductance variation is obtained by modifying the induction coefficient of a bar magnet 76 placed within a coil 74 and along its longitudinal axis. A control winding 78 connected to means 80 for supplying a current surrounds the bar magnet 76. The induction coefficient of the bar magnet 76 and therefore the inductance of the coil 74 are dependent on the intensity of the current passing through the control winding.

In this embodiment the coil 74 has two series of turns 74a, 74b wound in opposite direction. In this way it is possible to cancel out the "transformer" effect of the coil and consequently a protection is obtained against possible voltage pulses due to the reflection of the energy supplied to the laser tube 18, the impedances of said tube and of the supply circuit not being perfectly matched.

FIG. 6 diagrammatically shows different charging curves relative to an electric supply device like that of FIG. 2. Curves a,b,c respectively correspond to inductances of 400, 1000 and 2000 mH. In this case, the capacitance of the charging capacitor 20 is 8 nF and the laser shot repetition frequency is 5 kHz (one shot every 200 microseconds). Discharging takes place in approximately 200 ns, so that for the scale adopted in the drawing the discharge curve is substantially vertical.

It can be seen that as a function of the inductance L of the induction coil 42, the gradient of the charging curves varies. After 200 microseconds the voltage reached between the point A and earth is a function of said gradient. The power of the laser beam is a direct function of the said voltage. Thus, due to knowing the characteristics of the tube 18 which have been supplied by the designer, it is possible to regulate the inductance of the coil 42, so as to obtain the desired lighting power.

Moreover, this setting can be automated by the use of the closed-loop control means 21 of FIG. 2, which is described in greater detail hereinafter relative to FIG. 7.

The voltage supplied between point A and earth or ground is dependent on a nominal value determined by the user. Controlled by the signal Ic for triggering the thyratron 32, a voltmeter 210 measures the voltage applied between point A and earth. This voltmeter obtains a mean value for about 100 measurements and supplies on an output a signal indicating the mean voltage between point A and earth. This mean voltage is compared with the nominal value Vc by a comparator 212. The latter supplies a signal, which is a function of the comparison, to an input of a control device 214 able to supply a control signal Sc to an output. The signal Sc applied, according to the present variant, to an input of the motor 64 or to an input of the current generator 80 makes it possible to vary the inductance of the coil 42 so as to obtain a voltage equal to the nominal value during the triggering of the thyratron.

FIG. 8 diagrammatically shows a device according to the invention applied to the electric supply of several lasers. A single converter 40 converts the a.c. voltage of the mains in to a high d.c. voltage supplied between its positive and negative outputs.

Each of the tubes 18 is connected to a means for supplying a maximum regulatable amplitude pulse voltage. Thus, as a function of the inherent characteristics of each tube 18, the pulse voltage is regulated in such a way as to obtain the desired power for each laser beam.

In the embodiment shown in FIG. 8, each of the means for supplying a pulse voltage is in accordance with the embodiment of FIG. 2. All the said means are connected in a parallel arrangement to the positive and negative outputs of the converter 40. Each of the said means is provided with a switch enabling the tube 18 to be put into or out of operation when they are connected.

In a device according to the invention, the setting of the maximum amplitude of the pulse voltage is independent of the conversion of the a.c. voltage into a d.c. voltage.

For the electric supply of several lasers, only one converter is necessary. This makes it possible to increase the electrical efficiency of the conversion system and reduce the costs and volume of the electric supply. In addition, the converter can be remote from the laser without this causing any particular problem.

I claim:

1. Electric supply device for a plurality of metal vapour lasers, comprising a converter for converting an a.c. voltage into a fixed amplitude d.c. voltage, a plurality of means coupled to said convertor each of said means supplying, from said d.c. voltage, a pulse voltage, the maximum amplitude of which is adjustable in a continuous manner, each of said means incorporating a controllable switch; and an electric power charging circuit coupled to said switch, said circuit having a variable charging gradient and able to discharge said power as a result of the closure of said controllable switch.

2. Electric device for use with a plurality of lasers comprising a convertor for converting an a.c. voltage into a fixed amplitude d.c. voltage, at least one means for each of said plurality of lasers being respectively coupled to said convertor for supplying, from said d.c. voltage, a pulse voltage, the maximum amplitude of which is adjustable in a continuous manner, each of said means incorporating a controllable switch; and an electric power charging circuit coupled to said switch, said circuit including a variable induction coil and having a variable charging gradient and able to discharge said power as a result of the closure of said controllable switch.

3. Device according to claim 2, wherein the electric power charging takes place in a charging capacitor (20) connected at a point (A) to one electrode of a diode (24), the other electrode of said diode being connected to said variable induction coil (42) permitting the variation of the charging gradient of the charging circuit.

4. Electric device as claimed in claim 2, wherein a closed-loop control circuit is coupled to said variable induction coil to automatically vary the inductance thereof in a predetermined manner.

5. Electric device comprising a converter for converting an a.c. voltage into a fixed amplitude d.c. voltage, at least one means coupled to said converter for supplying, from said d.c. voltage, a pulse voltage, the maximum amplitude of which is regulatable, said means incorporating a controllable switch; an electric power charging circuit coupled to said switch, said circuit having a variable charging gradient and able to discharge said power as a result of the closure of said controllable switch, said electric power charging takes place in a charging capacitor connected at a point (A) to one electrode of a diode, the other electrode of said diode being connected to a variable induction coil permitting the variation of the charging gradient of the charging circuit; and wherein said variable induction coil incorporates at least two coils moving with respect to one another and connected in series so as to have a mutual inductance dependent on their respective position.

6. Electric device comprising a converter for converting an a.c. voltage into a fixed amplitude d.c. voltage, at least one means coupled to said converter for supplying, from said d.c. voltage, a pulse voltage, the maximum amplitude of which is regulatable, said means incorporating a controllable switch; an electric power charging circuit coupled to said switch, said circuit having a variable charging gradient and able to discharge said power as a result of the closure of said controllable switch, said electric power charging takes place in a charging capacitor connected at a point (A) to one electrode of a diode, the other electrode of said diode being connected to a variable induction coil permitting the variation of the charging gradient of the charging circuit; and wherein said variable induction coil has magnetic core moving longitudinally along the coil axis.

7. Electric device comprising a converter for converting an a.c. voltage into a fixed amplitude d.c. voltage, at least one means coupled to said converter for supplying, from said d.c. voltage, a pulse voltage, the maximum amplitude of which is regulatable, said means incorporating a controllable switch; an electric power charging circuit coupled to said switch, said circuit having a variable charging gradient and able to discharge said power as a result of the closure of said controllable switch, said electric power charging takes place in a charging capacitor connected at a point (A) to one electrode of a diode, the other electrode of said diode being connected to a variable induction coil permitting the variation of the charging gradient of the charging circuit; and wherein said variable induction coil has a ferromagnetic core introduced into a coil, a control winding surrounding the ferromagnetic core and further means for making a current flow in the control winding, so as to vary the induction of the core.

* * * * *